United States Patent [19]
Ehinger et al.

[11] Patent Number: 5,273,934
[45] Date of Patent: Dec. 28, 1993

[54] METHOD FOR PRODUCING A DOPED REGION IN A SUBSTRATE

[75] Inventors: Karl Ehinger, Karlsruhe; Michael Bianco; Helmut Klose, both of Munich, all of Fed. Rep. of Germany

[73] Assignee: Siemens Aktiengesellschaft, Munich

[21] Appl. No.: 881,166

[22] Filed: May 11, 1992

[30] Foreign Application Priority Data

Jun. 19, 1991 [DE] Fed. Rep. of Germany ....... 4120268

[51] Int. Cl.$^5$ ........................................... H01L 21/225
[52] U.S. Cl. ................................... 437/141; 437/164; 437/238; 437/950; 437/954; 148/DIG. 34
[58] Field of Search ........................... 437/31-33, 437/164, 186, 233, 235, 950, 954, 141, 238; 148/DIG. 35, DIG. 34, DIG. 37, DIG. 11

[56] References Cited

U.S. PATENT DOCUMENTS

| | | |
|---|---|---|
| 3,728,784 | 4/1973 | Schmidt . |
| 3,764,411 | 10/1973 | Brown . |
| 3,775,197 | 11/1973 | Sahagun . |
| 3,798,081 | 3/1974 | Beyer . |
| 4,586,968 | 5/1986 | Coello-Vera . |
| 4,996,168 | 2/1991 | Ozaki et al. . |

FOREIGN PATENT DOCUMENTS

| | | |
|---|---|---|
| 0031671 | 7/1981 | European Pat. Off. . |
| 0113405 | 7/1984 | European Pat. Off. . |
| 0304839 | 3/1989 | European Pat. Off. . |
| 0367729 | 5/1990 | European Pat. Off. . |
| 2031425 | 4/1990 | Japan . |
| WO86/04454 | 7/1986 | PCT Int'l Appl. . |
| WO87/02825 | 5/1987 | PCT Int'l Appl. . |

OTHER PUBLICATIONS

"Shallow Doping Profiles for High-Speed Bipolar Transistors", by K. Ehinger et al, Journal De Physique, Sep. 1988, pp. 109-112.

"Process & Device Performance of a High-Speed Double Poly-Si Bipolar Technology Using Borosenic-Poly Process with Coupling-Base Implant", by T. Yamaguchi et al, IEEE Transactions on Electron Devices, vol. 35, No. 8, Aug. 1988, pp. 1247-1256.

"Self-Aligned Technology for Sub-100nm Deep Base Junction Transistors", by M. Nakamae, Proc. of Essderc (1987), pp. 361-363.

"BSA Technology for sub-100nm Deep Base Bipolar Transistors", by Hisashi Takemura et al, NEC Research & Development, Jul. 1988, No. 90, Tokyo, Japan pp. 10-13.

"Doped Oxides as Diffusion Sources", by M. L. Barry, in: J. Electrochem Soc. (1970), vol. 117, No. 11, pp. 1405-1410.

"A 1-μm Polysilicon Self-Aligning Vipolar Process for Low-Power High-Speed Integrated Circuits", by H. Kabza et al, IEEE-Electron Device Letters, vol. 10, No. 8, Aug. 1989, pp. 344-346.

*Primary Examiner*—George Fourson
*Attorney, Agent, or Firm*—Hill, Steadman & Simpson

[57] ABSTRACT

A doped region (14) is produced in a substrate (11) of silicon by diffusion of dopant from a doped glass layer (13) that is arranged on an intermediate layer (12) situated on the substrate (11). The dopant concentration in the doped region (14) is thereby limited by the intermediate layer (12). The doped glass layer (13) is particularly produced by chemical vapor deposition of $(B(O-Si(CH_3)_3)_3)$.

17 Claims, 2 Drawing Sheets

METHOD FOR PRODUCING A DOPED REGION IN A SUBSTRATE

BACKGROUND OF THE INVENTION

In the manufacture of integrated circuits, dopant distributions are produced in semiconductor substrates of, for example, single-crystal silicon. These dopant concentrations are usually topically limited. The dopant distributions thereby have a given profile with a corresponding gradient perpendicular to the substrate surface.

Dopants are introduced into substrates by ion implantation or diffusion. In ion implantation, the distribution in the substrate is limited by a mask that is produced by photolithography. In the production of dopant distributions using diffusion, doped layers, for example, are arranged at the surface of the substrate, the dopant diffusing out of these doped layers. The form of the distribution in the plane of the substrate surface is thereby defined, for example, by a corresponding shaping of the doped layer. To that end, the doped layer is structured according to corresponding photolithographic definition.

The dopant profile perpendicular to the surface of the substrate is critically defined in the implantation by the dose and by the implantation energy. Given diffusion from a doped layer, the dopant profile perpendicular to the substrate surface is defined by the quantity of dopant contained in the dopant layer, by the segregation at the boundary surface to the substrate and by the length of diffusion.

In the production of shallow dopant profiles, i.e. of profiles having a slight penetration depth of the dopants, limits are set given employment of ion implantation in that the range of the ions is extremely great in certain crystal directions due to the channeling effect. A further practical problem is that only a few implantation systems are offered with which an implantation is possible with less than 10 keV implantation energy. Such low energies, however, are required in order to produce shallow dopant profiles with steep gradients. Extremely slight penetration depths for emitter/base and base/collector transitions are desirable in the manufacture of bipolar transistors having extremely short switching times. In a self-aligned double polysilicon process, both base terminals, as well as, emitter terminals are formed by a correspondingly doped polysilicon. The base terminal is insulated from the emitter terminal by an etch residue, what is referred to as a SiO₂ spacer, that remains in place after an unmasked, anisotropic etching of an oxide layer (see H. Kabza et al., IEEE-EDL (1989) Vol. 10, pages 344-346). The active base is produced inside the area defined by the etching residues. The contact between the base terminal and the active base is guaranteed by a doped region in the substrate under the base terminal, this region angularly surrounding the active base. This region is referred to as an inactive base, external base terminal or extrinsic base. The inactive base must overlap the active base given an adequate dopant concentration in order to supply a low-impedance base terminal resistance. The inactive base is thereby produced by drive-out from the base terminal.

When the active base is manufactured after the formation of the etching residues, then a high-impedance base terminal resistance arises because the active base and the inactive base do not overlap or only overlap with a dopant concentration that is too low (see K. Ehinger et al., Proc. of ESSDERC, J. Phys., C4, pages 109-112 (1988)).

Extremely steep base and emitter profiles having low penetration depth are achieved on the basis of what is referred to as double diffusion. What is understood by double diffusion is the successive diffusion of various dopants from the same polycrystalline silicon layer. In this case, the polycrystalline silicon layer for the emitter terminal is first doped with boron, the drive-out thereof leading to the formation of the active base, and is then doped with arsenic whose drive-out leads to the formation of the emitter. The overlap of active base and inactive bas is inadequate in this manufacturing method (see K. Ehinger et al., Proc. of ESSDERC, J. Phys., C4, pages 109-112 (1988)).

This problem can be resolved in various ways: the base can be produced by implantation before the formation of the etching residues. As a result thereof, the base is laterally expanded up to the edge of the base terminal. Although a good overlap between active and inactive base is thus established, implantation damage in the active region of the transistor nonetheless occurs, which potentially leads to a reduction in the yield. Moreover, the penetration depth of the dopants for the base cannot be made arbitrarily small because of the employment of the implantation.

Another possibility is implanting a part of the dopant concentration for the active base with low energy before the formation of the etching residues. Subsequently, the ultimate value of the base doping is set by drive-out from the polycrystalline silicon layer provided for the emitter terminal (see T. Yamaguchi et al., IEEE-ED (1988) Vol. 35, pages 1247-1256). However, as a result thereof the dopant concentration of the active base is increased under the emitter window and the base profile is thereby broadened.

A further possible solution is doping the etching residue that insulates the base terminal from the emitter terminal with boron (see M. Nakamae, Proc. of ESSDERC (1987), pages 361-363). Due to drive-out from the etching residue, the dopant concentration is locally elevated at the terminal location of the inactive base to the active base. The dopant concentration thereby achieved is prescribed by the quantity of dopant deposited in the etching residue, by the segregation at the boundary surface to the substrate and by the length of diffusion. In order to be able to set the base terminal resistance in a controlled fashion, the etching residue must be formed of a SiO₂ compound whose drive-out is suitably variable with a prescribed temperature budget.

It has been shown that boron-doped SiO₂ compounds dopable in an arbitrary concentration, as employed in M. Nakamae, Proc. of ESSDERC (1987), pages 361-363, are in a metastable condition. As a result thereof, crystallizations of the glass occur at certain locations. The characteristic of the drive-out is then changed at these locations, so that large topically dependent inhomogeneities of the dopant distribution in the substrate occur. This has a negative effect on the uniform setting of a low base terminal resistance.

SUMMARY OF THE INVENTION

The present invention is based on the problem of providing a method for producing a doped region in a substrate with which the dopant distribution can be well-controlled even given a low penetration depth and a steep gradient of the dopant.

This problem is inventively resolved in the method of the present invention for producing a doped region in a substrate. The method comprises the following steps:
a) an intermediate layer is produced on the surface of the substrate of semiconductor material;
b) a doped glass layer is produced on the intermediate layer;
c) in a temperature step, the doped region is formed in the substrate by diffusion of dopant from the doped glass layer through the intermediate layer; and
d) the intermediate layer is formed of a material that acts as diffusion barrier for the dopant, so that it limits the dopant concentration in the doped region.

Further developments of the present invention are as follows.

The substrate can be composed of a single-crystal silicon. The doped glass layer can be produced by chemical vapor deposition of $(B(OSi(CH_3)_3)_3)$ and the chemical vapor deposition can be implemented at 800° C. through 850° C. The intermediate layer can be formed with a thickness of up to 30 nm by thermal oxidation, or the intermediate layer can be formed with a thickness of 10 nm through 100 nm by chemical vapor deposition of $Si(OC_2H_5)_4$ (TEOS).

The temperature step for drive-out occurs at 850° C. through 1000° C. over 4 min through 20 min, or at 900° C. through 1100° C. over 1 sec through 120 sec. The doped glass layer and the intermediate layer are removed after the temperature step for drive-out.

In addition to the steps set forth above the method comprises the following steps:
a) a structure that has a vertical side wall is formed at the surface of the substrate before the production of the intermediate layer;
b) the intermediate layer is produced surface-wide and conforms to the surface of the substrate provided with the structure;
c) the doped glass layer is produced surface-wide and conforms to the surface of the intermediate layer;
d) in an anisotropic etching process, the doped glass layer and the intermediate layer are etched back so that an etching residue (spacer) results at the vertical side wall; and
e) the doped region in the substrate is formed by drive-out from the etching residue in a temperature step.

In the method with these further steps, the structure at the surface of the substrate can contain doped polycrystalline silicon. Also this method can be used in the manufacture of a bipolar transistor.

The intermediate layer thereby limits the drive-out of the dopants into the substrate. By varying the thickness and/or the density of the intermediate layer, the dopant distribution arising in the doped region is defined. The intermediate layer is formed, for example, of $SiO_2$, $Si_3N_4$, TiN, etc.

Since the density of a $SiO_2$ layer changes with the manufacturing conditions or deposition conditions, the resulting dopant distribution can be influenced, given employment of a $SiO_2$, by an appropriate selection of the process parameters. For example, given the same thickness, thermally produced $SiO_2$ exhibits a greater diffusion barrier effect than $SiO_2$ that was produced by decomposition of $Si(OC_2H_5)_4$ (what is referred to as TEOS) in a chemical vapor deposition (CVD) reactor.

A boron-doped glass layer that is produced by chemical vapor deposition of $B(OSi(CH_3)_3)_3$ is particularly used as a doped glass layer. A doped glass layer produced in this way exhibits no crystallization whatsoever. Since every deposited molecule contains the dopant in this case, the dopant concentration of the boron in the doped glass layer produced in this manner is constant. Given adequate thickness, such a doped glass layer practically represents an infinite boron source, this being also documented by measurements.

By employing the intermediate layer, a doped glass layer produced in this manner can be employed as a diffusion source for doped regions having different penetration depth of the boron dopant. It thereby is within the scope of the present invention to employ thermally produced oxides having thicknesses up to 30 nm or CVD-produced $SiO_2$ layers having thicknesses between 10 nm and 100 nm. The intermediate layer acts as a diffusion barrier and thus reduces the surface concentration of the boron and, thus, the penetration depth of the boron into the substrate. Also, by varying the local thickness of the intermediate layer, the penetration depth of the dopant can be designationally locally set.

The shaping of the doped region in the plane parallel to the surface of the substrate occurs, for example, by structuring the doped glass layer using photolithography before the drive-out. In this way, the doped region is limited to that surface of the substrate covered with the remaining, doped glass layer. It thereby is within the scope of the present invention to remove the doped glass layer and the intermediate layer in turn after the temperature step for drive-out of the dopant. This embodiment is particularly employed in the manufacture of an active base of a bipolar transistor according to the method of the present invention.

In a further embodiment of the present invention, a structure that has a perpendicular side wall vis-a-vis the surface of the substrate is formed before producing the intermediate layer at the surface of the substrate. The intermediate layer is produced surface-wide and in conformity on the surface of the substrate provided with the structure. The doped glass layer is produced thereon, again surface-wide and in conformity. In an anisotropic etching process, the doped glass layer and the intermediate layer are etched back, so that an etching residue (spacer) is formed at the perpendicular side wall. The doped region in the substrate is then formed in a temperature step by drive-out from the etching residue. A part of the intermediate layer that limits the drive-out continues to be arranged in the etching residue due to the manufacturing rule between the surface of the substrate and the part of doped glass.

In this embodiment, the doped region is produced self-aligned vis-a-vis the side wall of the structure. No photolithographic step is required in the formation of the spacer. This embodiment of the present invention is particularly suitable to assure a good overlap between the active and inactive base in the manufacture of a bipolar transistor. In this case, the etching residue is formed at a side wall of a base terminal of polycrystalline silicon that faces toward the emitter window. Since the inactive base is formed by drive-out from the base terminal and the active base is formed within the emitter window provided with the etching residue, the doped region, that is inventively produced from the etching residue, produces good contact between active base and inactive base.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
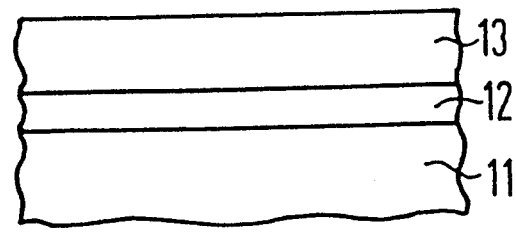
FIG. 1 and FIG. 2 show the manufacture of a doped region by drive-out from a doped glass layer that was structured by a photolithographic step.

An intermediate layer 12 of $SiO_2$ is produced on a substrate 11 of single-crystal silicon (see FIG. 1). For example, the intermediate layer 12 is formed by thermal oxidation of the surface of the substrate 11 in a thickness of, for example, up to 30 nm or by deposition of $SiO_2$ from the vapor phase after decomposition of Si-$(OC_2H_5)_4$ (what is referred to as TEOS) in a thickness of, for example, 20 nm.

A doped glass layer 13 is formed on the intermediate layer 12. The doped glass layer 13 is formed by chemical vapor deposition of $(B(OSi(CH_3)_3)_3)$ at a temperature of, for example, 800° C. through 850° C., preferably 840° C. For example, the doped glass layer 13 is produced in a thickness of 100 nm. It has a dopant concentration of the boron of approximately $4.3 \times 10^{22}$ cm$^{-3}$.

Figure 2:

After corresponding masking using photolithography, the doped glass layer 13 is structured such that it covers the surface of the substrate 11 in the region wherein a doped region 14 is to be formed. In a temperature step at, for example, 1050° C., the doped region 14 is formed by drive-out of the dopant from the doped glass layer 13 through the intermediate layer 12 into the substrate 11. The depth of the doped region 14 is thereby dependent on the thickness and density of the intermediate layer 12 (see FIG. 2).

Figure 3:
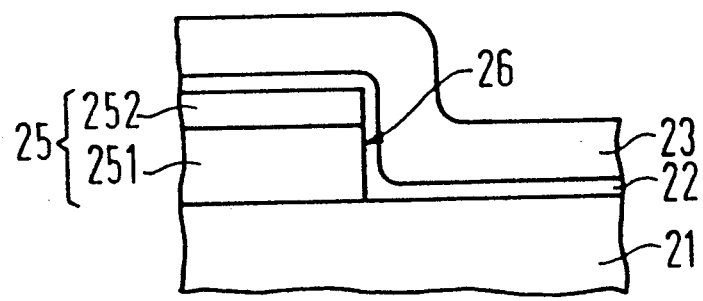
FIG. 3 and FIG. 4 show the manufacture of a doped region from an etching residue of doped glass formed self-aligned.

A structure 25 having a vertical side wall 26 is produced on a substrate 21 of single-crystal silicon (see FIG. 3). The structure 25 is formed on a polysilicon layer 251 and on a $SiO_2$ layer 252 arranged thereon. An intermediate layer 22 is produced surface-wide and conforming on the surface of the substrate 21 provided with the structure 25. For example, the intermediate layer 22 is formed by thermal oxidation or by chemical vapor deposition of TEOS in a thickness of, for example, 20 nm. A doped glass layer 23 is deposited surface-wide and conforming on the intermediate layer 22. For example, the doped glass layer 23 is formed by chemical vapor deposition of $B(OSi(CH_3)_3)_3$.

Figure 4:
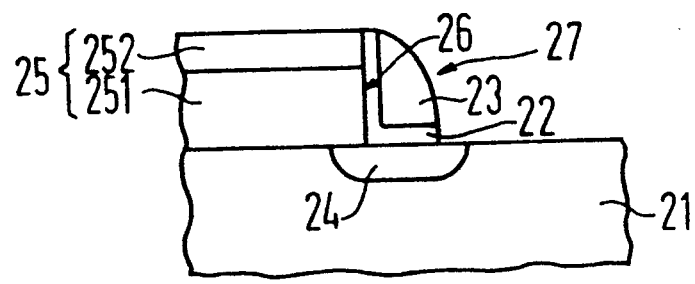

In an anisotropic etching process, the doped glass layer 23 and the intermediate layer 22 are etched back, so that an etching residue, what is referred to as a spacer 27, occurs at the side walls, whereas all planar regions are etched free. The spacer 27 is arranged at the side wall 26 of the structure 25 (see FIG. 4). In a temperature step at, for example, 1050° C., 20 seconds long, a doped region 24 is produced by drive-out of the dopant from the doped glass layer 23 through the intermediate layer 22 into the substrate 21. The position of the doped region 24 relative to the side wall 26 of the structure 25 is thereby self-aligned by the spacer technique.

Figure 5:
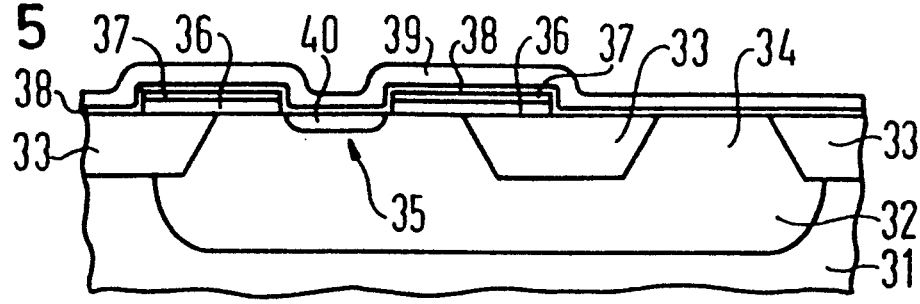
FIG. 5 and FIG. 6 show the manufacture of a bipolar transistor wherein the active base is produced by drive-out from a doped glass layer.

The method of the present invention is suitable for use in the manufacture of a bipolar transistor. It is also particularly suitable for the production of an active base in a bipolar transistor in a double polysilicon process as described, for example, in H. Kabza et al., IEEE-EDL (1989), Vol. 10, pages 344–346. A n+-doped region 32 is arranged in a p-doped silicon substrate 31 for the acceptance of the active parts of the bipolar transistor. Field oxide regions 33 insulate the n-doped region 32 at the surface of the substrate 31 in the substrate 31 from neighboring switch elements in the substrate 31. Further, a field oxide region 33 insulates a deeply extending collector terminal 34 arranged in the n+-doped region 32 from the active transistor region 35. A base terminal 36 is arranged at the surface of the substrate 31. The base terminal 36 is composed of B-doped polysilicon. The base terminal 36 angularly surrounds the active transistor region 35. The base terminal 36 has its surface provided with an insulation structure 37 of, for example, $SiO_2$. An intermediate layer 38 of, for example, thermally produced silicon oxide having a thickness of up to 30 nm is arranged at the surface of the insulation structure 37 and of the active transistor region 35. A doped glass layer 39 is arranged on the intermediate layer 38. For example, the doped glass layer 39 has been produced by chemical vapor deposition of $B(OSi(CH_3)_3)_3$ at, for example, 840° C. The doped glass layer 39 has a thickness of, for example, 100 nm. On the basis of a temperature step at, for example, 1050° C. over, for example, 20 seconds, an active base 40 is produced by drive-out of the boron dopant from the doped glass layer 39 through the intermediate layer 38 into the active transistor region 35 (see FIG. 5). The base width of the active base 40 (i.e., the penetration depth of the dopant) amounts, for example, to 85 nm.

Figure 6:
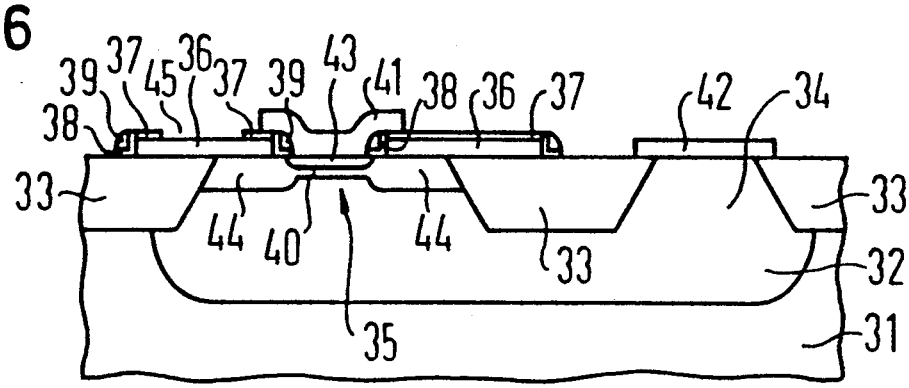

After removal of the doped glass layer 39 and of the intermediate layer 38 so that etching residues of boron-doped glass and oxide lying therebelow remain at the side walls whereas the planar surfaces are etched free, an emitter terminal 41 and a collector terminal 42 each of n-doped polysilicon are formed (see FIG. 6). The emitter terminal 41 is thereby formed above the active transistor region 35. The collector terminal 42 is formed above the more deeply extending collector terminal 34. After drive-out of dopant from the emitter terminal 41 for forming an emitter 43 and after drive-out of dopant from the base terminal 36 for forming an inactive base 44 that angularly surrounds and adjoins the active base 40 the bipolar transistor is finished by opening a via hole 45 on the base terminal 36 see FIG. 6).

Figure 7:
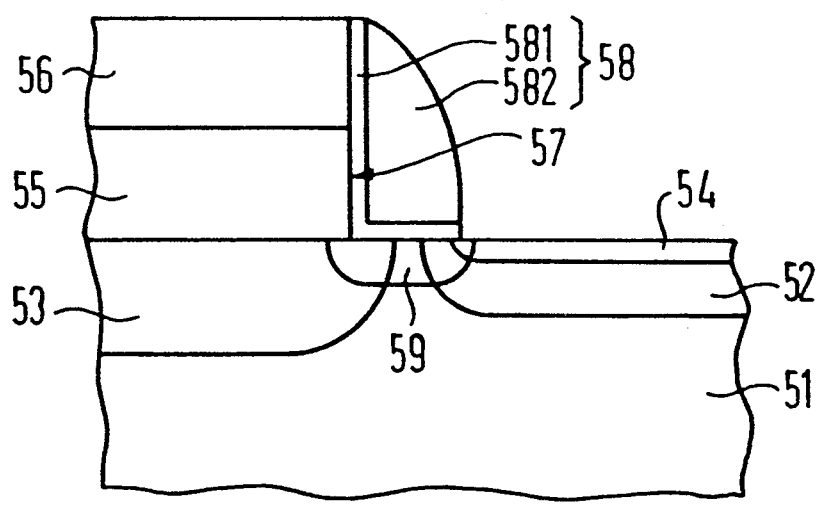
FIG. 7 shows the manufacture of a connection between an active base and an inactive base of a bipolar transistor.

The method of the present invention is also suitable for improving the contact between an active base and an inactive base in a bipolar transistor. A portion of a bipolar transistor is shown in FIG. 7. An active base 52 and an inactive base 53 are arranged in an n-doped region 51 of a silicon substrate. An emitter 54 is arranged at the surface of the substrate in the region of the active base 52. A base terminal 55 of B-doped polysilicon is arranged above the inactive base 53 on the surface of the substrate. The base terminal 55 is covered with an oxide layer 56. The oxide layer 56 and the base terminal 55 have a common side wall 57 that is perpendicular vis-a-vis the surface of the substrate.

A spacer 58 is formed at the side wall 57 from, for example, a 10 nm thick intermediate layer of thermal oxide that is arranged on the surface of the oxide layer 56, of the side wall 57 and of the substrate and from a doped glass layer arranged thereon. This occurs by an anisotropic re-etching, as set forth in detail with reference to FIGS. 3 and 4. The spacer 58 has a layer 581 of thermal oxide and a portion 582 of doped glass that cover the side wall 57 and the surface of the substrate. The doped glass layer is produced by chemical vapor deposition of $B(OSi(CH_3)_3)_3$. In a temperature step at, for example, 1050° C., the dopant is driven out from the part 582 of the spacer 58 through the layer 581 into the substrate 51. A doped region 59 that connects the active base 52 to the inactive base 53 thereby arises. The base terminal resistance is noticeably improved in this way. The arrangement of the doped region ensues self-aligned via the formation of the spacer 58.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing a doped region in a substrate, comprising the steps of:
   a) producing an intermediate layer on a surface of the substrate of semiconductor material;
   b) producing a doped glass layer on the intermediate layer by chemical vapor deposition of $B(OSi(CH_3)_3)_3$;
   c) in a heating step, forming a doped region in the substrate by diffusion of dopant from the doped glass layer through the intermediate layer; and
   d) forming the intermediate layer from a material that acts as a diffusion barrier for the dopant during the heating step, so that the intermediate layer limits the dopant concentration in the doped region.

2. The method according to claim 1, wherein the substrate is composed of single-crystal silicon.

3. The method according to claim 1, wherein the chemical vapor deposition is implemented at a temperature in the range of 800° C. to 850° C.

4. The method according to claim 1, wherein the intermediate layer is formed with a thickness of up to 30 nm by thermal oxidation.

5. The method according to claim 1, wherein the intermediate layer is formed with a thickness in the range of 10 nm to 100 nm by chemical vapor deposition of $Si(OC_2H_5)_4$.

6. The method according to claim 1, wherein the heating step for drive-out occurs in the range of 850° C. to 1000° C. over 4 min through 20 min.

7. The method according to claim 1, wherein the doped glass layer and the intermediate layer are removed after the heating step for drive-out.

8. The method according to claim 1, wherein the method further comprises the steps of:
   forming a structure that has a vertical side wall at the surface of the substrate before the production of the intermediate layer;
   producing the intermediate layer surface-wide, the intermediate layer conforming to the surface of the substrate provided with the structure;
   producing the doped glass layer surface-wide, the doped glass layer conforming to a surface of the intermediate layer;
   in an anisotropic etching process, etching back the doped glass layer and the intermediate layer so that an etching residue of the doped glass layer and the intermediate layer as a spacer is formed at the vertical side wall;
   forming the doped region in the substrate by drive-out from the etching residue in a heating step.

9. The method according to claim 8, wherein the structure at the surface of the substrate contains doped polycrystalline silicon.

10. The method according to claim 7, wherein the method is used in the manufacture of a bipolar transistor, wherein after removal of the doped glass layer and of the intermediate layer an emitter terminal, a collector terminal and a base terminal are formed.

11. The method according to claim 8, wherein the method is used in the manufacture of a bipolar transistor, wherein after removal of the doped glass layer and of the intermediate layer an emitter terminal, a collector terminal and a base terminal are formed.

12. The method according to claim 1, wherein the heating step for drive-out occurs in the range of 900° C. to 1100° C. over 1 sec through 120 sec.

13. A method for producing a doped region in a substrate, comprising the steps of:
   a) providing a substrate composed of single-crystal silicon;
   b) producing an intermediate layer on a surface of the substrate;
   c) producing a doped glass layer on the intermediate layer by chemical vapor deposition of $B(OSi(CH_3)_3)_3$;
   d) in a heating step, forming a doped region in the substrate by diffusion of dopant from the doped glass layer through the intermediate layer, the intermediate layer being formed from a material that acts as a diffusion barrier for the dopant during the heating step, so that the intermediate layer limits the dopant concentration in the doped region; and removing the doped glass layer and the intermediate layer from the surface of the substrate.

14. The method according to claim 13, wherein the chemical vapor deposition is implemented at a temperature in the range of 800° C. to 850° C.

15. A method for producing a doped region in a substrate, comprising the steps of:
   a) providing a substrate;
   b) forming a structure that has a vertical side wall at a surface of the substrate;
   c) producing an intermediate layer surface-wide, the intermediate layer conforming to the surface of the substrate provided with the structure;
   d) producing a doped glass layer surface-wide on the intermediate layer by chemical vapor deposition of $B(OSi(CH_3)_3)_3$, the doped glass layer conforming to a surface of the intermediate layer;
   e) in an anisotropic etching process, etching back the doped glass layer and the intermediate layer so that an etching residue of the doped glass layer and the intermediate layer as a spacer is formed at the vertical side wall; and
   f) forming a doped region in the substrate by drive-out from the etching residue in a heating step, the doped region in the substrate being formed by diffusion of dopant from the doped glass layer through the intermediate layer, and the intermediate layer being formed from a material that acts as a diffusion barrier for the dopant during the heating step, so that the intermediate layer limits the dopant concentration in the doped region.

16. The method according to claim 15, wherein the substrate is composed of single-crystal silicon.

17. The method according to claim 15, wherein the structure at the surface of the substrate contains doped polycrystalline silicon.

* * * * *